United States Patent
Fueldner et al.

(10) Patent No.: US 8,604,566 B2
(45) Date of Patent: Dec. 10, 2013

(54) SENSOR MODULE AND SEMICONDUCTOR CHIP

(75) Inventors: Marc Fueldner, Neubiberg (DE); Alfons Dehé, Neufahrn (DE)

(73) Assignee: Infineon Technologies AG, Neubiberg (DE)

( * ) Notice: Subject to any disclaimer, the term of this patent is extended or adjusted under 35 U.S.C. 154(b) by 883 days.

(21) Appl. No.: 12/140,762

(22) Filed: Jun. 17, 2008

(65) Prior Publication Data

US 2009/0309174 A1 Dec. 17, 2009

(51) Int. Cl.
H01L 29/84 (2006.01)

(52) U.S. Cl.
USPC ............... 257/416; 257/414; 257/E21.499; 438/51; 438/53

(58) Field of Classification Search
CPC .............. B81B 2201/0257; B81C 1/0023; H04R 2201/003
USPC ............ 257/414–417, E21.499; 438/51, 53
See application file for complete search history.

(56) References Cited

U.S. PATENT DOCUMENTS

| | | | | |
|---|---|---|---|---|
| 4,530,029 A | * | 7/1985 | Beristain | 361/283.4 |
| 7,812,416 B2 | * | 10/2010 | Courcimault | 257/414 |
| RE42,346 E | * | 5/2011 | Rombach et al. | 381/174 |
| 7,938,014 B2 | * | 5/2011 | Meehan et al. | 73/780 |
| 2005/0185812 A1 | | 8/2005 | Minervini | |
| 2007/0063297 A1 | * | 3/2007 | Takada et al. | 257/415 |
| 2007/0275494 A1 | * | 11/2007 | Mayer et al. | 438/50 |
| 2009/0001553 A1 | | 1/2009 | Pahl | |

FOREIGN PATENT DOCUMENTS

| | | |
|---|---|---|
| DE | 4111119 A1 | 10/1992 |
| DE | 102004011148 B3 | 11/2005 |
| DE | 102005031601 A1 | 1/2007 |
| DE | 102005053765 | 5/2007 |
| DE | 102006022379 A1 | 11/2007 |
| JP | 02063173 A * | 3/1990 |
| JP | 03049267 A * | 3/1991 |
| JP | 03112170 A * | 5/1991 |
| WO | 2005086532 | 9/2005 |
| WO | 2007054071 A1 | 5/2007 |

* cited by examiner

*Primary Examiner* — Kenneth Parker
*Assistant Examiner* — Jose R Diaz
(74) *Attorney, Agent, or Firm* — Dicke, Billig & Czaja, PLLC

(57) ABSTRACT

A sensor module and semiconductor chip. One embodiment provides a carrier. A semiconductor chip includes a first recess and a second recess and a main surface of the semiconductor chip. The semiconductor chip is mounted to the carrier such that the first recess forms a first cavity with the carrier and the second recess forms a second cavity with the carrier. The first cavity is in fluid connection with the second cavity.

21 Claims, 12 Drawing Sheets

FIG 4
A
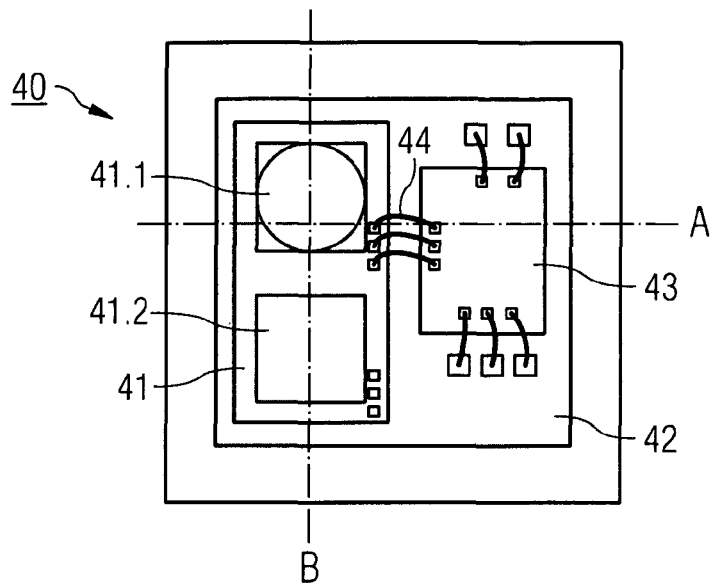
B
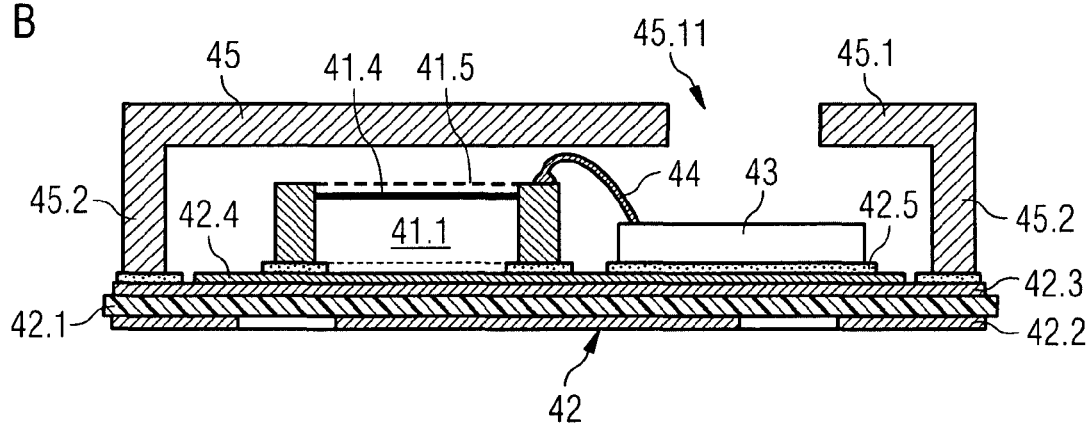
C
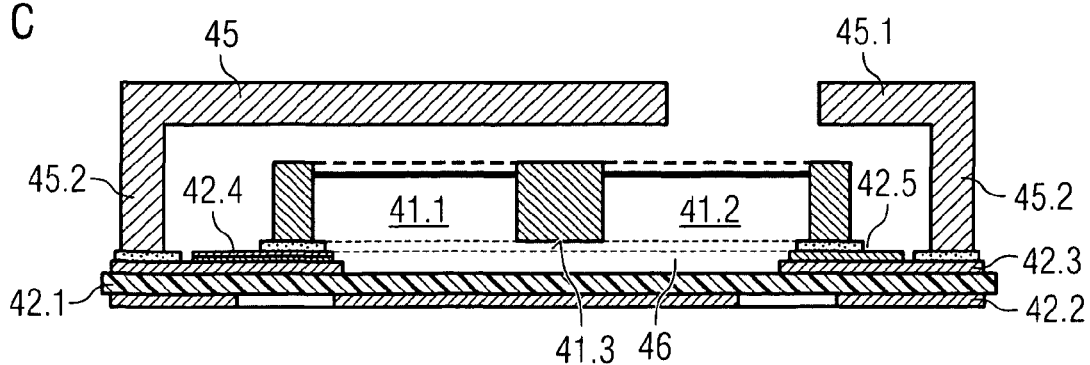

FIG 6
A
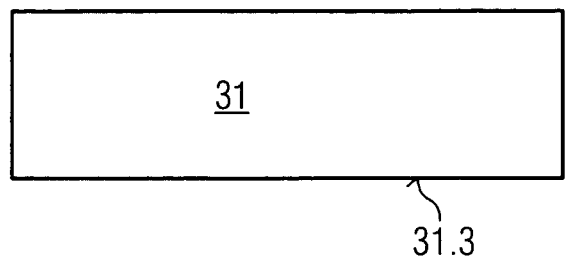
B
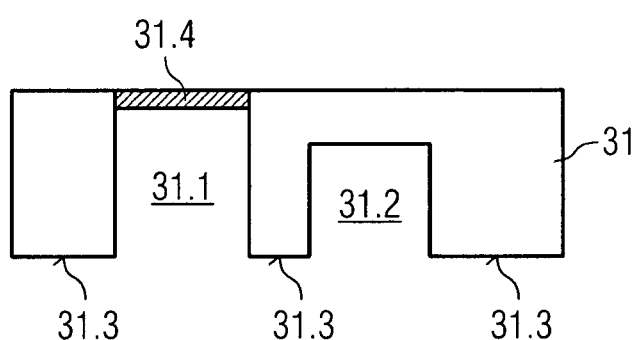
C
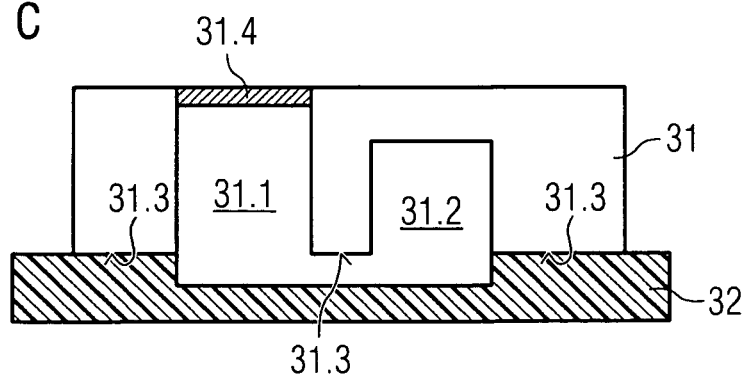

FIG 7
A (upper part)
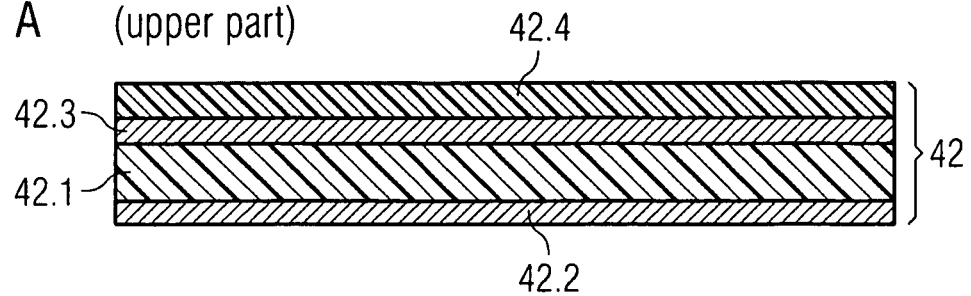
B (lower part)
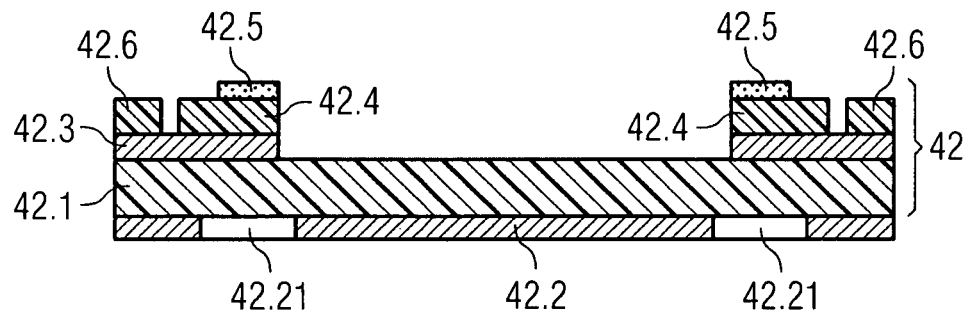
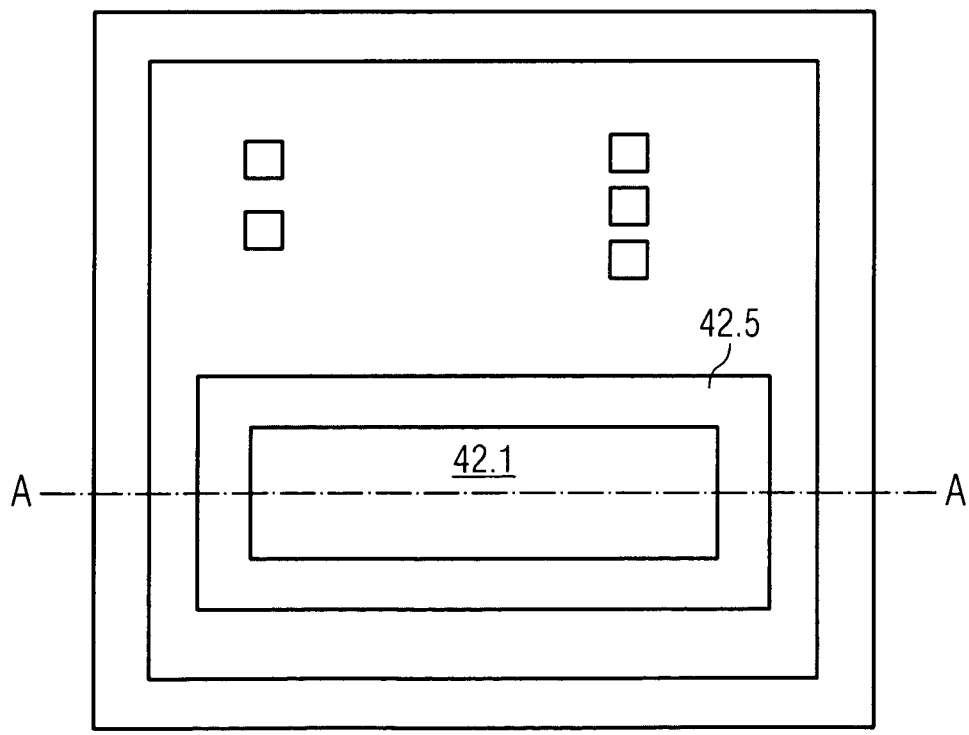

FIG 7
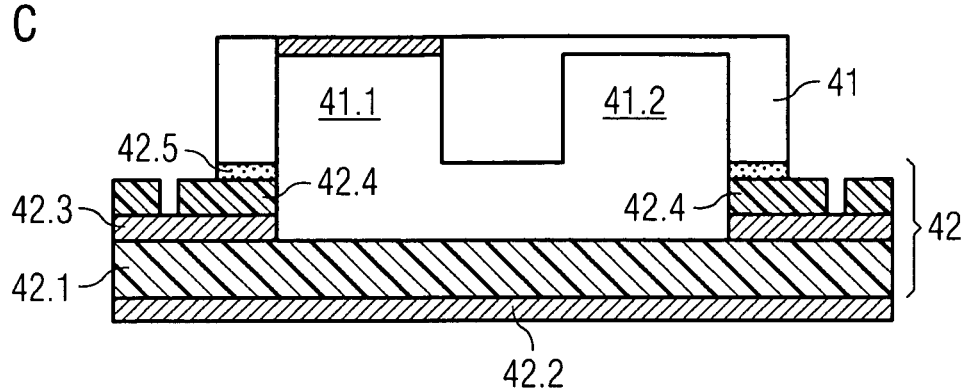
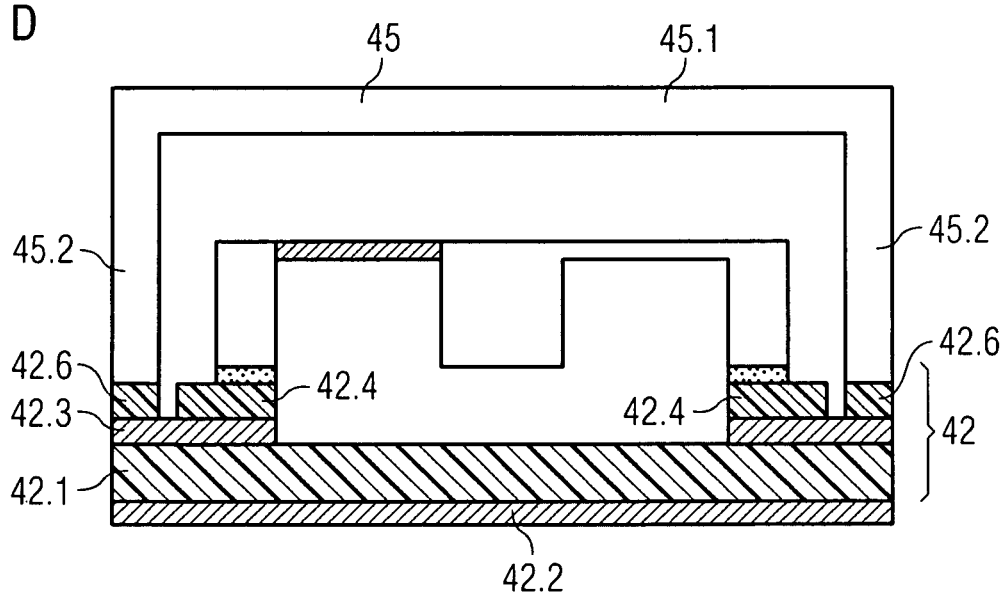

FIG 12
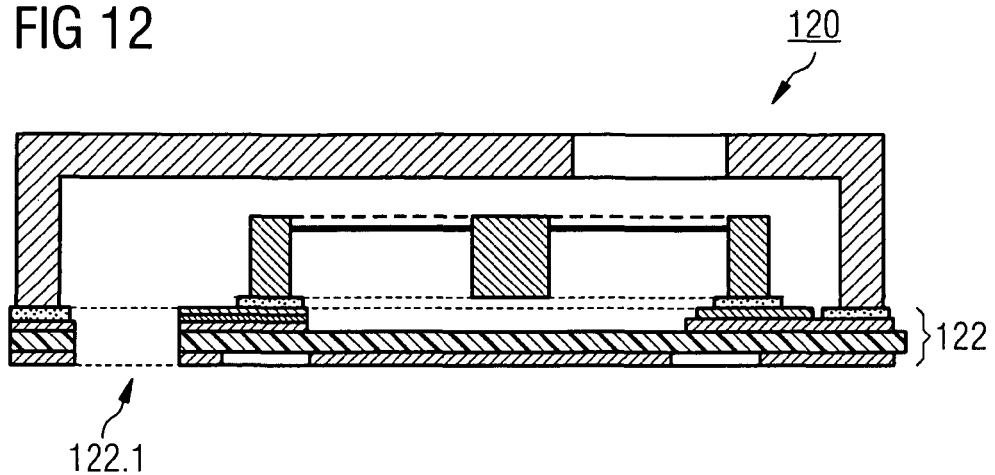
FIG 13
A
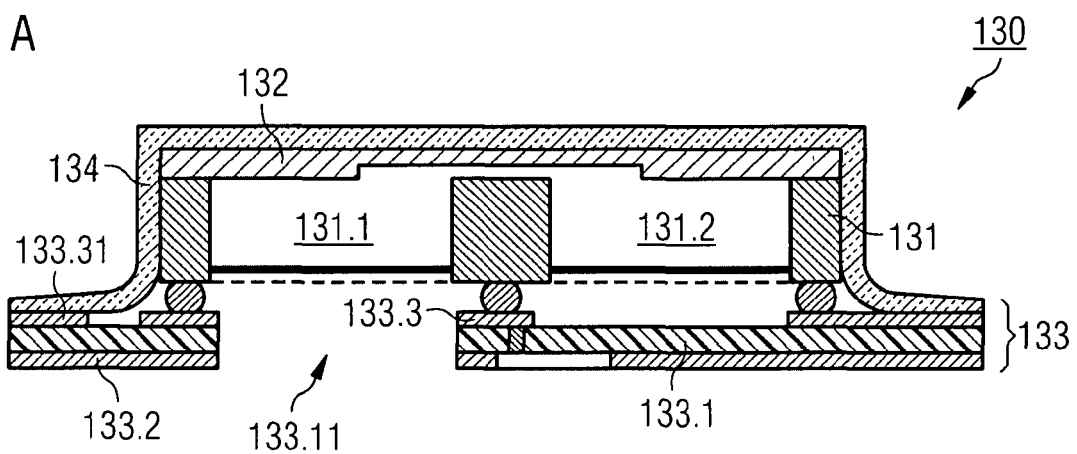
B
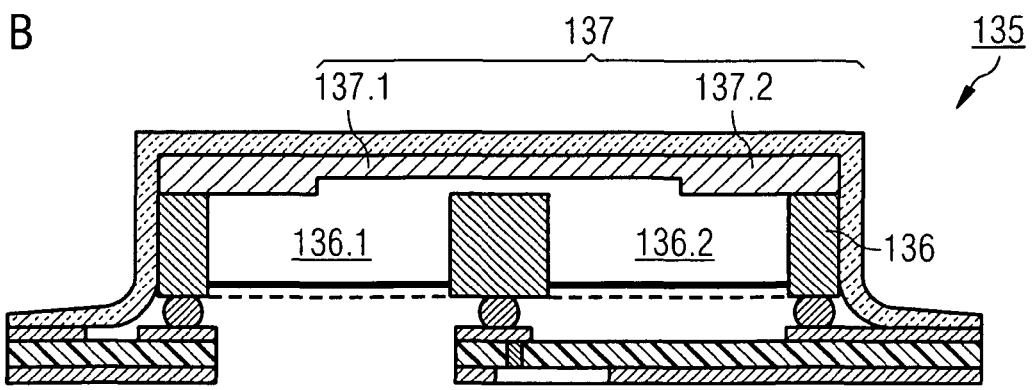

FIG 14
A
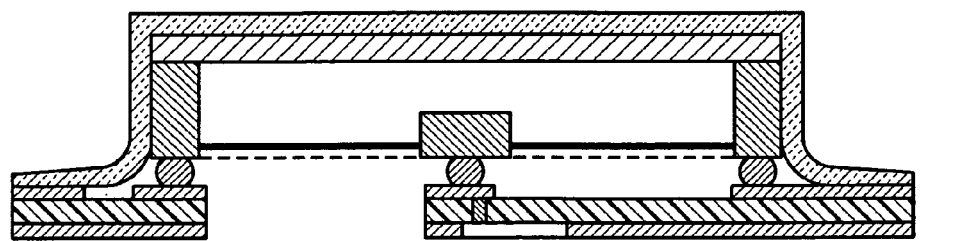
140
B
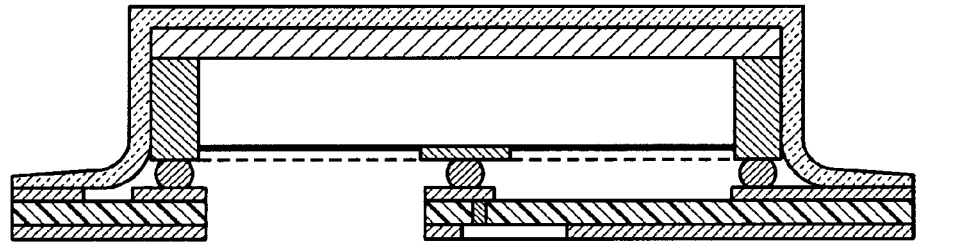
145
FIG 15
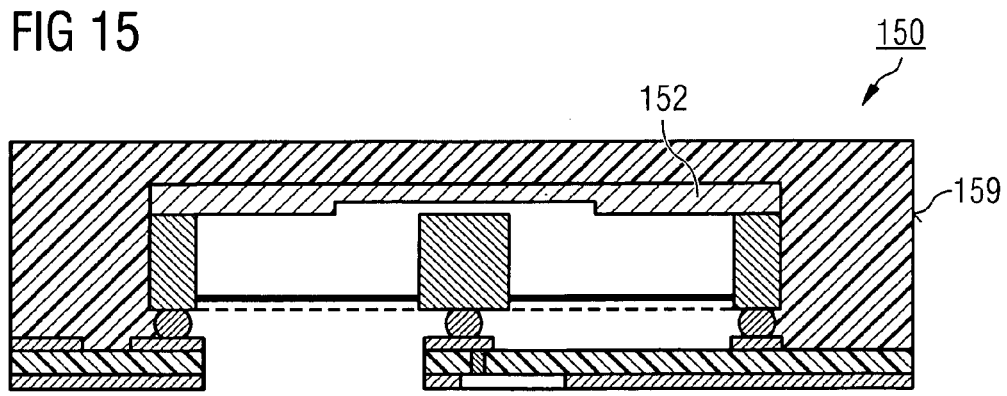
150
152
159

SENSOR MODULE AND SEMICONDUCTOR CHIP

BACKGROUND

The invention relates to a sensor module, a semiconductor chip, a method for fabricating a semiconductor module, and a method for fabricating a semiconductor chip.

Sensor modules may contain a sensor like, for example, a micro-electro-mechanical microphone. Typically such a micro-electro-mechanical microphone is fabricated in form of a semiconductor chip which is attached to a carrier. This assembly is mounted in a casing which is built of several components wherein one component of the casing is typically made of a printed circuit board. Micro-electro-mechanical microphones packaged like this are used for transform sound into electrical signals in applications where a miniaturization is of special interest.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 4A-C illustrate a top view (A), a first sectional view (B) and a second sectional view (C) of a sensor module according to one embodiment.

FIGS. 6A-C illustrate sectional side views of intermediate products and a sensor module for illustrating one embodiment of a method for fabricating a sensor module.

FIGS. 7A-D illustrate sectional side views of intermediate products and a sensor module for illustrating one embodiment of a method for fabricating a sensor module.

FIG. 12 illustrates a sectional side view of a sensor module according to one embodiment.

FIGS. 13A,B illustrate sectional side views of sensor modules according to embodiments.

FIGS. 14A,B illustrate sectional side views of sensor modules according to one or more embodiments; and FIG. 15 illustrates a sectional side view of a sensor module according to one embodiment.

DETAILED DESCRIPTION

Figure 1:
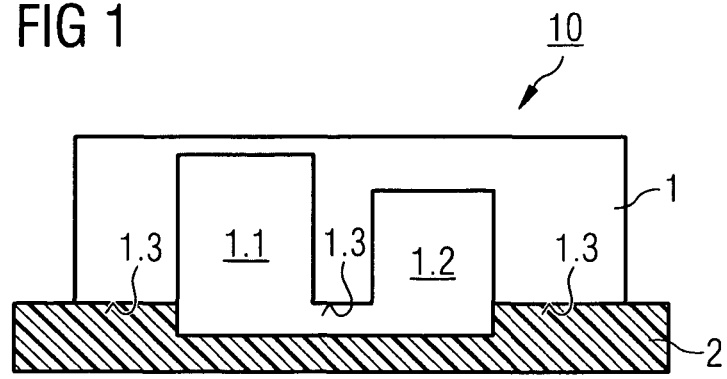
FIG. 1 illustrates a sectional side view of a sensor module according to one embodiment.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal.

Sensor modules, semiconductor chips, sensor chips and assembly described in the following include embodiments of a micro-electro-mechanical microphone which dynamically transforms sound e.g., in the audible frequency range into electrical signals. One embodiment of a sensor module may include a semiconductor chip containing a microphone based on a capacitor including two electrodes wherein one electrode is made of a thin membrane as already well-known for those skilled in the art. The semiconductor chip can, for example, be a silicon chip wherein, however, also other semiconductor materials like, for example, SiGe or GaAs, can be used.

In several embodiments of a sensor module a semiconductor chip can be attached to a carrier. The carrier could be, in principle, any kind of carrier made of any kind of material. The carrier can, for example, include a single layer of a laminate material or any other insulating material or it can include multiple layers with a base layer of a laminate material and metallization layers deposited on both main surfaces of the base layers.

The sensor module can include a sensor chip which can, for example, be a microphone chip, in one embodiment, a micro-electro-mechanical microphone chip. The sensor module can further include a processor chip for processing signals from the sensor chip. The processor chip can be, for example, an ASIC chip, an FPGA chip, a digital signal processor chip, or the like.

In several embodiments a semiconductor chip is mounted onto a carrier or layers or layer stacks are applied to one another or materials are applied or deposited onto layers or carriers. It should be appreciated that any such terms as "mounted" or "applied" or "deposited" are meant to cover literally all kinds and techniques of applying chips to carriers or layers to each other or materials onto layers or carriers.

Several embodiments are related to a semiconductor chip. It should be appreciated that this is meant to cover a single semiconductor chip which has already been separated from a semiconductor wafer as well as a semiconductor chip which is still part of a semiconductor wafer and not yet separated from the semiconductor wafer wherein the semiconductor wafer might contain one or more of further semiconductor chips of one or more of the same kind, form or function.

Referring to FIG. 1, there is illustrated a sectional side view of a sensor module according to one embodiment. The sensor module 10 as depicted in FIG. 1 includes a carrier 2, a semiconductor chip 1 including a first recess 1.1 and a second recess 1.2 in a main surface 1.3 of the semiconductor chip 1, wherein the semiconductor chip 1 is mounted to the carrier 2 such that the first recess 1.1 forms a first cavity with the carrier 2 and the second recess 1.2 forms a second cavity with the carrier 2, and wherein the first cavity is in fluid connection with the second cavity.

According to one embodiment of the sensor module 10, the first cavity and the second cavity form a common cavity that is hermetically sealed. This can be accomplished by attaching the semiconductor chip 1 in such a way to the carrier 2 so that the common cavity formed by the first cavity and the second cavity is hermetically sealed from the outside. In one embodiment the semiconductor chip 1 can be attached in an air-tight manner to the carrier 2.

According to one embodiment of the sensor module 10, the common cavity formed by the first cavity and the second cavity is not completely or hermetically sealed from the outside. In this case the attachment of the semiconductor chip 1 to the carrier 2 may be such that it is not completely air-tight so that, for example, small amounts of air or moisture can pass in either one of directions into or out of the common cavity with respect to the outside.

According to one embodiment of the sensor module 10, the sensor module 10 further includes a membrane defined by the first recess 1.1. Such a membrane may, for example, be part of a capacitor of a micro-electro-mechanical microphone.

According to one embodiment of the sensor module 10, the first recess 1.1 and the second recess 1.2 have the same depth. In FIG. 1 one embodiment of a sensor module 10 is illustrated in which the first recess 1.1 and the second recess 1.2 have different depths. However, it might be advantageous with respect to the fabrication process to provide the same depths of the first recess 1.1 and the second recess 1.2 as will be outlined further below.

According to one embodiment of the sensor module 10, the second cavity is as large as, or larger than the first cavity. In general the second cavity can have any arbitrary volume. However, it can be advantageous if the second cavity is as large as, or larger than the first cavity. In one embodiment, the second recess 1.2 can be as large as, or larger than the first recess 1.1.

According to one embodiment of the sensor module 10, the first recess 1.1 and the second recess 1.2 have inclined side walls. In one embodiment, the side walls of the first recess 1.1 and the second recess 1.2 may correspond to crystallographic planes of the semiconductor material of the semiconductor chip 1, which may, for example, result from a wet etching process.

According to one embodiment of the sensor module 10, the first recess 1.1 and the second recess 1.2 have vertical side walls. In one embodiment, the side walls of the first recess 1.1 and the second recess 1.2 may be fabricated by an etching process like, for example, reactive ion etching (RIE), deep reactive ion etching (DRIE) or reactive ion beam etching (RIBE).

Figure 2:
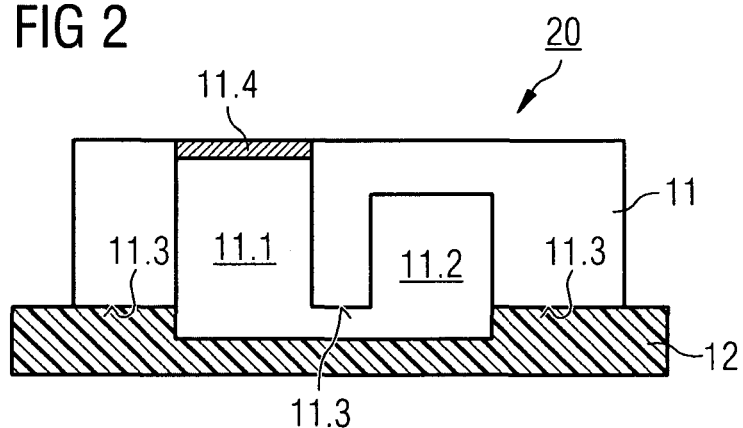
FIG. 2 illustrates a sectional side view of a sensor module according to one embodiment.

Referring to FIG. 2, there is illustrated a sectional side view of a sensor module according to one embodiment. The sensor module 20 as illustrated in FIG. 2 includes a carrier 12, a semiconductor chip 11 including a first recess 11.1 and a second recess 11.2 in a main surface 11.3 of the semiconductor chip 11, and a membrane 11.4 defined by the first recess 11.1.

According to one embodiment of the sensor module 20, the semiconductor chip 11 is mounted to the carrier 12 such that the first recess 11.1 forms a first cavity with the carrier 12 and the second recess 11.2 forms a second cavity with the carrier 12. In one embodiment the first cavity and the second cavity can be arranged such that they are in fluid connection with each other. According to one embodiment, the first cavity and the second cavity may form a common cavity that may or may not be hermetically sealed.

According to one embodiment of the sensor module 20, the second cavity is as large as, or larger than the first cavity. In one embodiment, the second recess 11.2 is as large as, or larger than the first cavity.

According to one embodiment of the sensor module 20, the first recess 11.1 and the second recess 11.2 have the same depth.

According to one embodiment of the sensor module 20, the side walls of the first recess 11.1 and the second recess 11.2 can have inclined side walls, in one embodiment side walls corresponding to crystallographic planes of the semiconductor material of the semiconductor chip 11.

According to one embodiment of the sensor module 20, the side walls of the first recess 11.1 and the second recess 11.2 can have vertical side walls.

Figure 3:
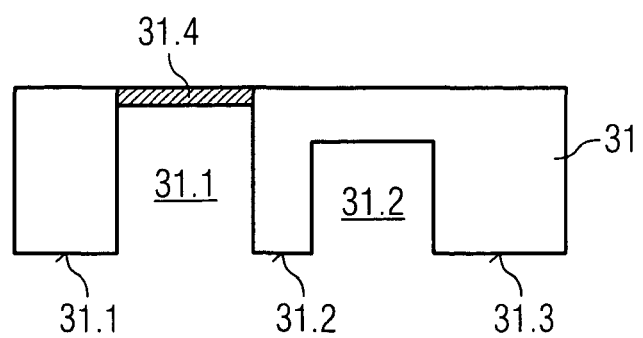
FIG. 3 illustrates a sectional side view of a semiconductor chip according to one embodiment.

Referring to FIG. 3, there is illustrated a sectional side view of a semiconductor chip according to one embodiment. The semiconductor chip 31 as illustrated in FIG. 3 includes a first recess 31.1 and a second recess 31.2 in a main surface 31.3 of the semiconductor chip 31, and a membrane 31.4 defined by the first recess 31.1.

According to one embodiment of the semiconductor chip 31, the first recess 31.1 and the second recess 31.2 have the same depths.

According to one embodiment of the semiconductor chip 31, the side walls of the first recess 31.1 and the second recess 31.2 are inclined.

According to one embodiment of the semiconductor chip 31, the side walls of the first recess 31.1 and the second recess 31.2 correspond to one or more of the crystallographic planes of the semiconductor material of the semiconductor chip 31.

According to one embodiment of the semiconductor chip 31, the side walls of the first recess 31.1 and the second recess 31.2 are vertical.

According to one embodiment of the semiconductor chip 31, the semiconductor chip 31 further includes a capacitor including the membrane 31.4 and an electrode opposite to the membrane 31.4.

According to one embodiment of the semiconductor chip 31, the semiconductor chip 31 is a microphone chip, in one embodiment a micro-electro-mechanical microphone chip.

Referring to FIGS. 4A-C, there are illustrated top view (A) and sectional side view representations (B, C) of a sensor module according to one embodiment. FIG. 4B represents a cross-section along line A of FIG. 4A and FIG. 4C represents a cross-section along line B of FIG. 4A. The sensor module 40 includes a semiconductor chip 41 which is mounted to a carrier 42. The semiconductor chip 41 includes a first recess 41.1 and a second recess 41.2 in a main surface 41.3 of the semiconductor chip 41. The semiconductor chip 41 is mounted to the carrier 42 such that the first recess 41.1 forms a first cavity with the carrier 42 and the second recess 41.2 forms a second cavity with the carrier 42. The first cavity is in fluid connection with the second cavity as can be seen in FIG. 4C.

The first recess 41.1 and the second recess 41.2 have the same depth and on the bottom of the first recess 41.1 a membrane 41.4 is provided which forms a first electrode of a capacitor wherein a second electrode 41.5 of the capacitor is rigid and stationary and positioned opposite to the membrane 41.4. The membrane 41.4 can be elongated by sound waves so that the capacity of the capacitor is varied with the same frequency as that of the sound waves which can be converted into an electrical signal so that the semiconductor chip 41 functions as a microphone. The details of the arrangement and configuration of the capacitor of the microphone are known to those skilled in the art and will not be described in further detail here.

The sensor module 40 also includes a second chip 43 which is located beside the semiconductor chip 41 which can be seen in FIGS. 4A,B. The second chip 43 can be a processor chip like, for example, an ASIC chip. The second chip 43 processes the electrical signals received from the semiconductor chip 41 and it is electrically connected to the semiconductor chip 41 by bond wires 44.

The sensor module 40 further includes a housing 45 for protecting the semiconductor chip 41 and the processor chip 43. The housing 45 is attached to the carrier 42 and it includes a ceiling wall 45.1 and side walls 45.2 connected to the ceiling wall 45.1 and to the carrier 42. The ceiling wall 45.1 includes a through-hole 45.11 for the passage of sound into the interior of the housing 45 and to the membrane 41.4 of the semiconductor chip 41.

Both the first recess 41.1 and the second recess 41.2 have circular cross-sections as can be seen in FIG. 4A. The first cavity formed by the first recess 41.1 and the carrier 42 and the second cavity formed by the second recess 41.2 and the carrier 42 are connected with each other by a coupling channel 45 as can be seen in FIG. 4C. The coupling channel 46 extends along line B of FIG. 4A and it is obtained by structuring one or more of the upper layers of the carrier 42, i.e. removing a particular portion of these upper layers so that the empty space resulting from the removement will serve as the coupling channel 46. The carrier 42 includes a base layer 42.1, a lower metallization layer 42.2, an upper metallization layer 42.3, a solder resist layer 42.4 and an adhesion layer 42.5. For forming the coupling channel 46 between the first cavity and the second cavity one or more of the solder resist layer 42.4, the upper metallization layer 42.3 and the base layer 42.1 have to be removed in a particular region between the first cavity and the second cavity. In one embodiment, as many layers as possible are removed so that the coupling channel 46 will be formed with a large cross-section.

The provision of the second cavity and the coupling of the second cavity to the first cavity via the coupling channel 45 provides for a significant increase of the back volume of the microphone arrangement without increasing the overall height of the sensor module and also without increasing the active sensor region, that is the region of the membrane. As known to one skilled in the art, the back volume of these kinds of microphones as described in this application, essentially defines the sensitivity or S/N ratio of the microphone and that in order to increase the sensitivity of the microphone the back volume must be increased without increasing the area of the membrane at the same time. An increase of the back volume by increasing the height of the sensor module may not be advantageous. Therefore, the concept of providing a second cavity in fluid connection with the first cavity is a solution for increasing the back volume of the microphone.

The additional back volume must have a back wall which is rigid against sound, at least rigid as compared to the flexibility of the membrane 41.4. This can be accomplished, for example, by producing a thicker membrane at or near to the bottom of the second recess 41.2 as related to the membrane 41.4 at or near to the bottom of the first recess 41.1 and, more specifically, by not removing a sacrificial oxide between the membrane and the second capacitor electrode at the bottom of the second recess 41.2 as opposed to the first recess 41.1 where the sacrificial oxide is removed between the membrane 41.4 and the second electrode 41.5. As a result a thick membrane will be produced at or near to the bottom of the recess 41.2. In addition or alternative thereto a passivation layer might not be removed at the bottom of the second recess 41.2 so that as well a thick membrane will result at or near to the bottom of the second recess 41.2.

Figure 5:
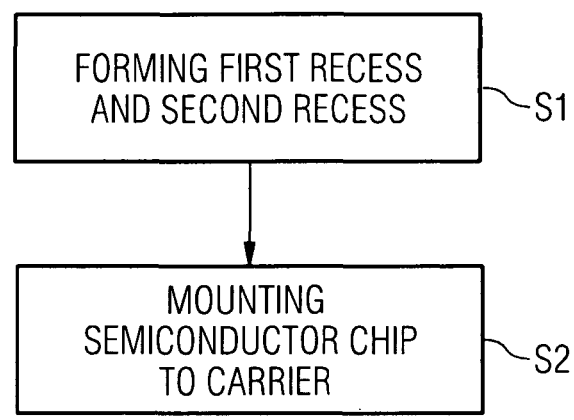
FIG. 5 illustrates a flow chart of a method for fabricating a sensor module.

Referring to FIG. 5, there is illustrated a flow chart of a method for fabricating a sensor module according to one embodiment. The method includes forming a first recess and a second recess in a main surface of a semiconductor chip (s1), and mounting the semiconductor chip to a carrier such that the first recess forms a first cavity with the carrier and the second recess forms a second cavity with the carrier and the first cavity is in fluid connection with the second cavity (s2).

According to one embodiment of the method of FIG. 5, the first recess and the second recess are formed by etching. In one embodiment a wet chemical etching can be applied which in the case of a silicon chip results in a strong anisotropical etching behaviour.

According to one embodiment of the method of FIG. 5, the first recess and the second recess are formed by reactive ion etching (RIE), deep reactive etching (DRIE), reactive ion beam etching (RIBE) or the like.

According to one embodiment of the method of FIG. 5, the first recess is formed such that it is defined by a membrane.

According to one embodiment of the method of FIG. 5, the first recess and the second recess are formed such that they have the same depth.

According to one embodiment of the method of FIG. 5, the semiconductor chip is mounted to the carrier such that the first cavity and the second cavity form a common cavity that is sealed from the outside.

Referring to FIGS. 6A-C, there are illustrated sectional side views of intermediate products and a sensor module for illustrating one embodiment of a method for fabricating a sensor module. FIG. 6A illustrates a sectional side view of a semiconductor chip 31 wherein the semiconductor chip 31 can be part of a semiconductor wafer containing a plurality of semiconductor chips like this. FIG. 6B illustrates a sectional side view of an intermediate product obtained after forming a first recess 31.1 and a second recess 31.2 in a main surface 31.3 of the semiconductor chip 31. The first and second recesses 31.1 and 31.2 can be fabricated simultaneously in, for example, a simultaneous etching process of etching through a mask into the main surface 31.3 of the semiconductor chip 31. It may therefore be the that the first and second recesses 31.1 and 31.2 are formed with the same depth. However, the depth of the first and second recesses 31.1 and 31.2 can also be different as is illustrated in FIG. 6B. FIG. 6C illustrates a sectional side view of a sensor module wherein the semiconductor chip 31 is attached to a carrier 32 in such a way that a first cavity is formed by the first recess 31.1 and the carrier 32 and a second cavity is formed by the second recess 31.2 and the carrier 32 and the first cavity and the second cavity are in fluid connection with each other.

Referring to FIGS. 7A-D, there are illustrated sectional side views of intermediate products and a sensor module for illustrating one embodiment of a method for fabricating a sensor module. FIG. 7A illustrates a sectional side view of a carrier 42. The carrier 42 includes a base layer 42.1 which can, for example, be a layer made of a laminate material or any other plastic or insulating material. A first metallization layer 42.2 is deposited onto the backside of the base layer 42.1. The first metallization layer 42.2 will be processed such that it contains electrical contact areas 42.21, in one embodiment flat contact pads ("lands") which can be used to make contact to electrical connection elements of a PCB board or lead frame onto which the finished sensor module is to be mounted in a later stage. A second metallization layer 42.3 is deposited onto a front side of the base layer 42.1. The electrical contact areas 42.21 are connected by electrical via connections (not illustrated) in the base layer 42.1 with electrical contact areas of the second metallization layer 42.3. A solder resist layer 42.4 is deposited onto the second metallization layer 42.3.

Referring to FIG. 7B, an intermediate product is illustrated after structuring the carrier 42, i.e. removing a part of the carrier 42 and forming a recess therein. An upper part of FIG. 7B illustrates a sectional side view of the intermediate product whereas a lower part of FIG. 7B illustrates a top view of the intermediate product. As can be seen in FIG. 7B, a recess is formed into the second metallization layer 42.3 and the solder resist layer 42.4 wherein the recess is formed in a rectangular shaped area as can be seen in the lower part in FIG. 7B. The recess is supposed to become the coupling channel between the first and second cavities as will be illustrated further below. After forming the recess a first adhesive layer 42.5 is deposited in the form of a rectangular shaped ring on the edge portion of the recess, i.e. on the edge portion of the solder resist layer 42.4. A second adhesive layer 42.6 is deposited in form of a rectangular or square shaped ring on an edge portion of the carrier 42, i.e. on an edge portion of the second metallization layer 42.3.

Referring to FIG. 7C, a sectional side view of an intermediate product is illustrated after attaching a semiconductor chip 41 to the carrier 42. The semiconductor chip 41 can, for example, be identical with the semiconductor chip 41 as already illustrated with respect to FIGS. 4A-C and it can be fabricated, for example, as explained in connection with FIG. 6. The semiconductor chip 41 includes a first recess 41.1 and a second recess 41.2. The semiconductor chip 41 is attached with its outer rim portion to the first adhesive layer 42.5 so that the first recess 41.1 forms a first cavity with the carrier 42 and the second recess 41.2 forms a second cavity with the carrier 42 and the recess formed into the carrier 42 will have the function of a conduction channel between the first and second cavities.

Referring to FIG. 7D, a housing 45 is attached to the carrier 42. The housing 45 can have a rectangular or square cross-section and it can include a ceiling wall 45.1 and four side walls 45.2 connected to the ceiling wall 45.1. The housing 45 thus includes a rectangular or square shaped rim with which it is attached to the second adhesive layer 42.6. The second adhesive layer 42.6 is formed onto a contact area of the second metallization layer 42.3. This contact area may serve the purpose of a mass electrode of the sensor module and the housing 45 may be fabricated from an electrically conductive material so that the housing 45 in operation of the sensor module serves the purpose of a mass-connected shield. In this case the second conductive layer 42.6 would have to be an electrically conductive material like, for example, silver paste or the like.

In a further process, which is not illustrated, a second chip 43 (cf. FIGS. 4A, B) which can be an ASIC chip is attached to the solder resist layer 42.4. As illustrated in FIG. 4B, the second chip 43 can be attached to the solder resist layer 42.4 by using a further adhesive layer wherein this further adhesive layer can be formed in one and the same process together with the first adhesive layer 42.6. Afterwards the chips 41 and 43 are electrically connected with each other by bond wires 44 and the second chip 43 is connected with further bond wires to electrical contact areas of the second metallization layer 42.3, which electrical contact areas can be seen in the top view of FIG. 4A.

Figure 8:
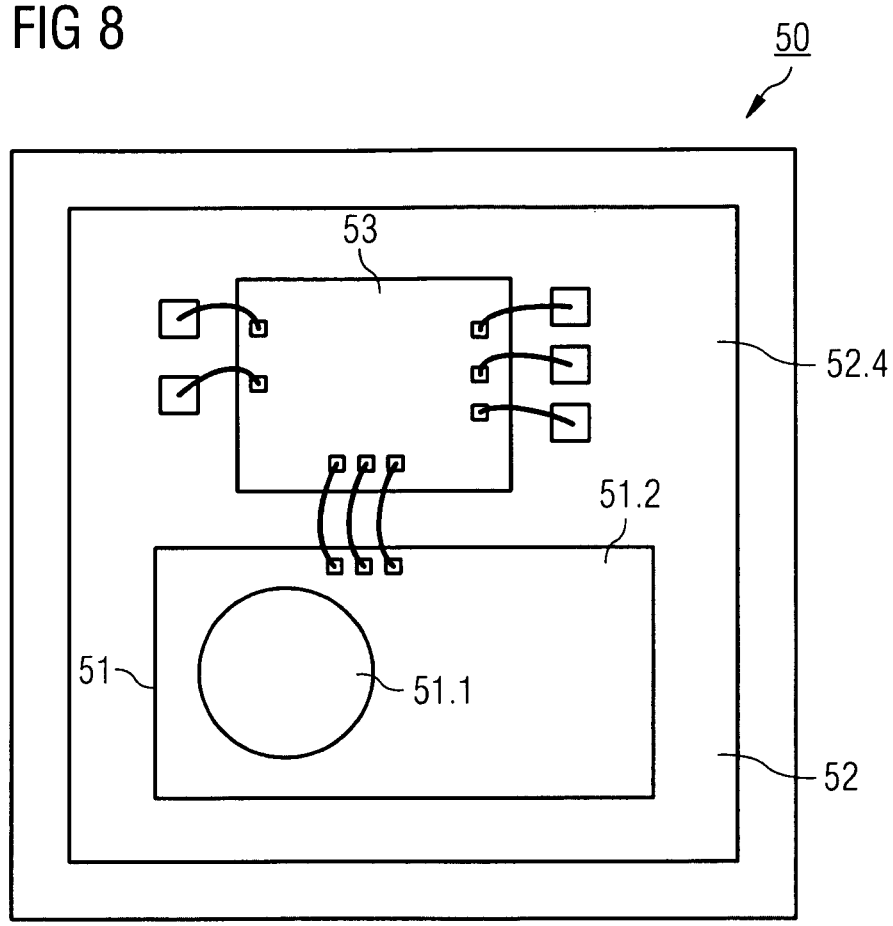
FIG. 8 illustrates a top view of a sensor module according to one embodiment.

Referring to FIG. 8, there is illustrated a top view of a sensor module according to one embodiment. The sensor module 50 includes a semiconductor chip 51 and a second chip 53, wherein both chips 51 and 53 are attached to a carrier 52 from which an uppermost layer 52.4 is illustrated which can, for example, be a solder resist layer 52.4. The only difference between the sensor module 50 of FIG. 8 and the sensor module 40 as described in connection with FIGS. 4A-C is the form of the second recess 51.2 and the second cavity which is formed by the second recess 51.2 and the carrier 52. In contrast to the sensor module 40 of FIGS. 4A-C, the second recess 51.2 has a rectangular cross-section so that also the second cavity formed by the second recess 51.2 and the carrier 52 has a rectangular cross-section. The first recess 51.1 is illustrated with a circular cross-section. However, in principle it is also possible that the first recess 51.1 and therefore also the first cavity formed by the first recess 51.1 and the carrier 52 has a rectangular cross-section wherein also other cross-sections of the first and second recesses are possible. All other features of the sensor module 50 can be identical to the sensor module 40 of FIGS. 4A-C.

Figure 9:
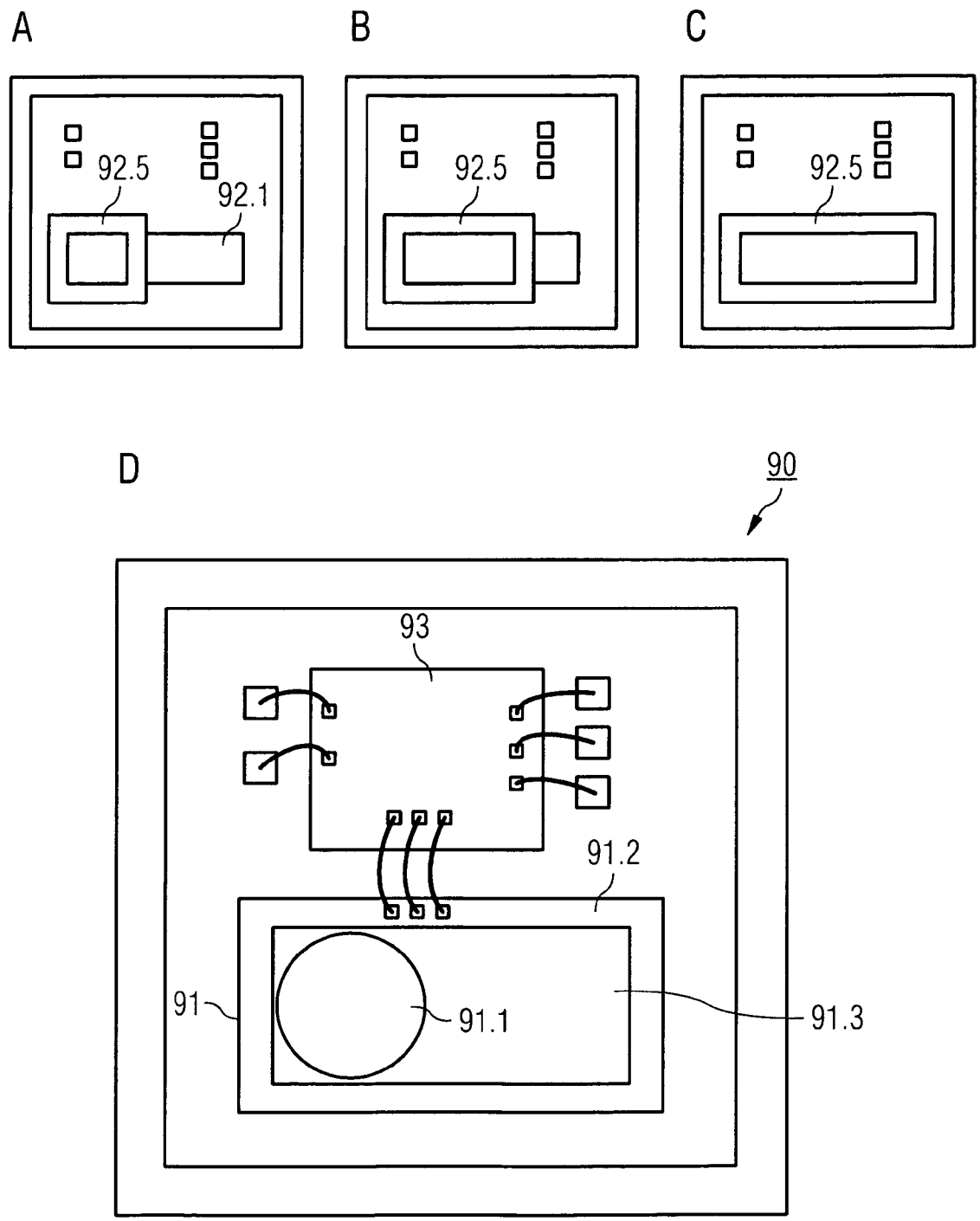
FIGS. 9A-D illustrate top views of intermediate products for fabricating different embodiments of sensor modules (A-C) and of a sensor module (D).

Referring to FIGS. 9A-D, there are illustrated top views of intermediate products (A-C) for illustrating embodiments of a sensor module and a top view of a sensor module 90 according to one of these embodiments. The embodiments of sensor modules illustrate that by different designs of the first adhesive layer 92.5, which was designated with the reference sign 42.5 in FIGS. 4A-C and FIGS. 7A-D, the sensitivity level of the sensor module can be flexibly adjusted according to given requirements. The top views of FIGS. 9A-C are to be compared with the lower part of FIG. 7B. Each one of the top views of FIGS. 9A-C illustrates that a recess is formed into the carrier, i.e. a solder resist layer (not illustrated) and an underlying second metallization layer (not illustrated), the recess being of a rectangular cross-sectional shape and of equal size in all three embodiments. Through the recess a portion of the underlying base layer 92.1 of a carrier can be seen. However, the rectangular ring-shaped adhesive layer 92.5 is of different size in the three embodiments. In the embodiment of FIG. 9C the adhesive layer 92.5 is of the same size and shape as the adhesive layer 42.5 illustrated in FIG. 4C. However, in the embodiments of FIGS. 9A,B the adhesive layer 62.5 is of a smaller size in that the adhesive layer 92.5 is not formed entirely on the edge of the recess as formed in the solder resist layer and the metallization layer. Instead the adhesive layer 92.5 includes one portion which extends across the recess. This means that when a semiconductor chip like the semiconductor chip 41 of the embodiment as illustrated in FIGS. 4A-C is attached to a carrier fabricated like this, only part of the second recess and of the second cavity will become effective as a back volume of the microphone chip. The semiconductor module 90 as illustrated in FIG. 9D includes a semiconductor chip 91 which has a first recess 91.1 containing the microphone membrane and second and third recesses 91.2 and 91.3. With one of the adhesive layer designs of FIGS. 9A-C different back volumes can be adjusted as the adhesive layer design of FIG. 9A would lead only to a back volume corresponding to the first cavity formed by the first recess 91.1 and the carrier, the adhesive layer design of FIG. 9B would lead to a back volume corresponding to the first cavity plus the second cavity formed by the second recess 91.2 and the carrier, and the adhesive layer design of FIG. 9C would lead to a back volume corresponding to the first cavity, the second cavity and a third cavity formed by the third recess 91.3 and the carrier. In this way the desired level of sensitivity of the sensor module can be chosen by choosing the right design of the adhesive layer 92.5.

Figure 10:
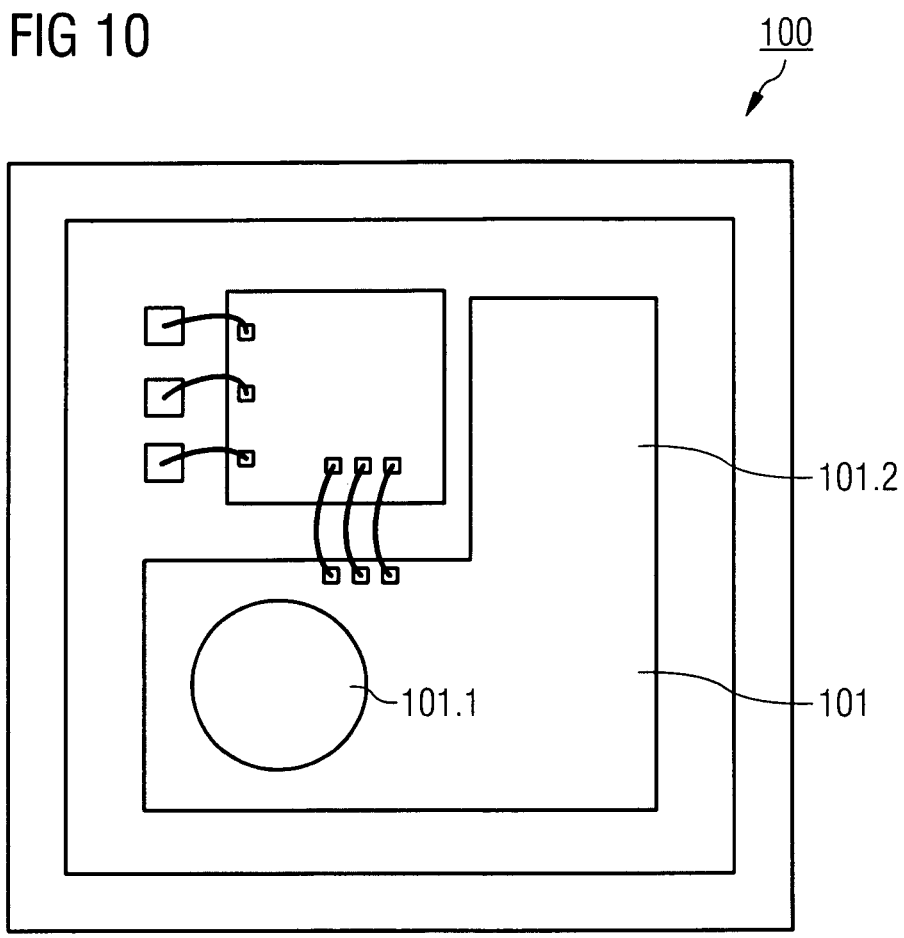
FIG. 10 illustrates a top view of a sensor module according to one embodiment.

Referring to FIG. 10, there is illustrated a top view of a sensor module according to one embodiment. The sensor module 100 includes a semiconductor chip 101 which has a non-rectangular shape. More specifically, the semiconductor chip 101 has the shape of a corner in which two rectangular shaped parts are formed together to form a right angle. In one of the rectangular shaped parts a first recess 101.1 is contained and a second recess 101.2 is formed adjacent to the first recess 101.1 whereas the second recess 101.2 also has a shape like a corner having one part formed in one part of the semiconductor chip 101 and another part formed in the other part of the semiconductor chip 101 wherein the two parts are forming a right angle. Such a design of a semiconductor chip 101 allows for a maximum back volume while maintaining a compact form of the sensor module 100 at the same time.

Figure 11:
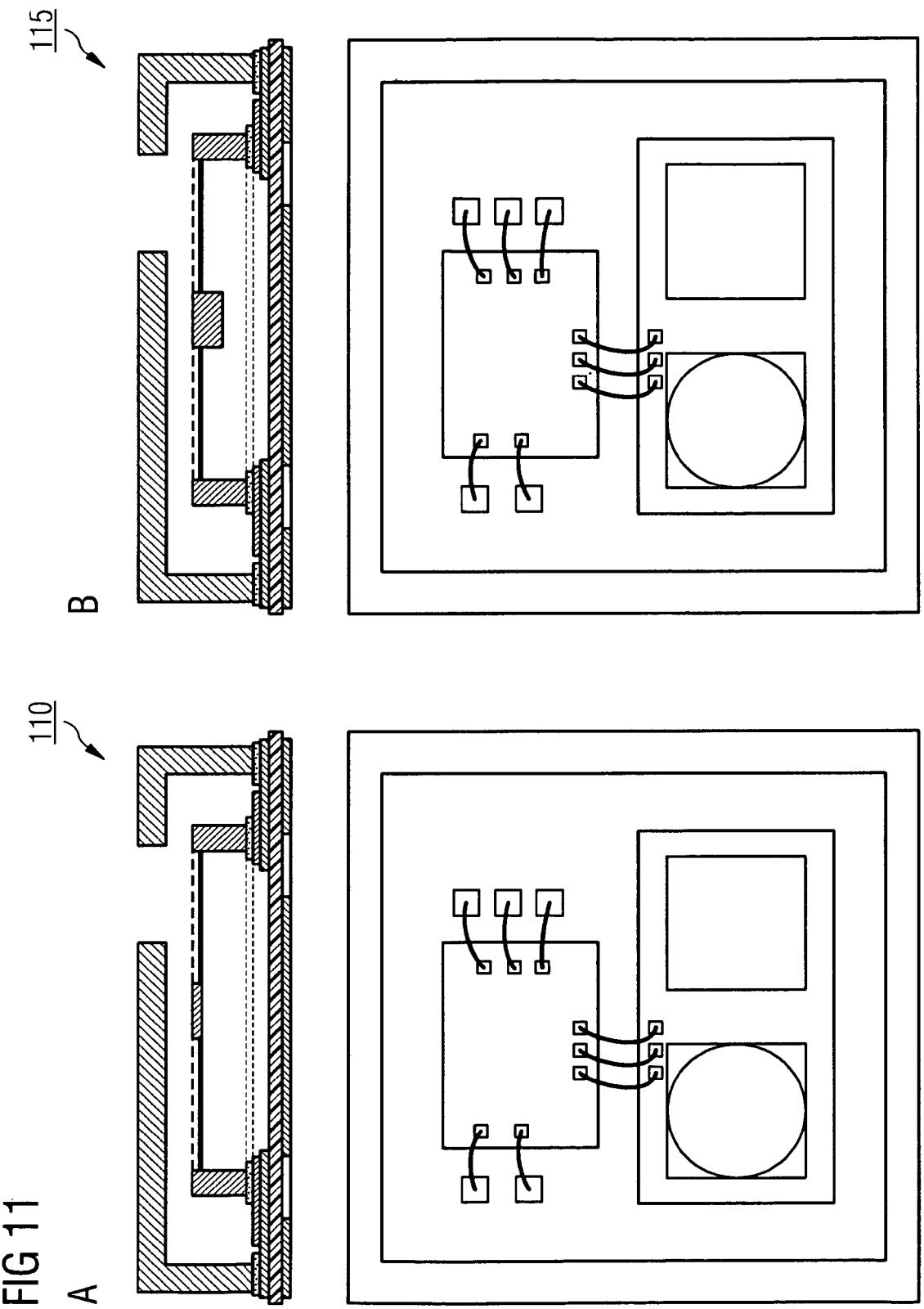
FIGS. 11A,B illustrate sectional side views and top views, respectively, of sensor modules according to one or more embodiments.

Referring to FIGS. 11A,B, there are illustrated embodiments of sensor modules in which the coupling channel is formed by a structuring of the semiconductor chip itself and not, or not necessarily, by structuring of the carrier. For that purpose the semiconductor material, in one embodiment the silicon, is removed in part or completely in the region between the first and second recesses. FIG. 11A illustrates in its upper partial picture a sectional side view of one embodiment of a sensor module 110 in which the silicon is completely removed in the region connecting the first and second recesses whereas the lower partial picture of FIG. 11A illustrates a top view of the semiconductor module. FIG. 11B illustrates in its upper partial picture a sectional side view of a sensor module 115 in which the silicon is partially removed in the region connecting the first and second recesses whereas the lower partial picture of FIG. 11B illustrates a top view of the sensor module 115 in which it can be seen that the silicon is only removed in a number of equally spaced slits between the first and second recesses. In both embodiments the upper layers of the carrier have also been removed as in the previously described embodiments and in addition the silicon in the region between the first and second recesses has been removed completely or partially. It is of course also possible to remove only the silicon in the region between the first and second recesses completely or partially.

Referring to FIG. 12, there is illustrated a sectional side view of a sensor module according to one embodiment. In the following only the differences with respect to the embodiment as described in connection with FIGS. 4A-C are described. One essential difference is that the sensor module 120 of FIG. 12 includes a carrier 122 and a housing 125 and the carrier 122 includes an opening 122.11 which serves as a sound opening. Therefore, in contrast to the embodiments of FIGS. 4A-C, the sound opening is not provided in the housing 125 but instead in the carrier 122.

Referring to FIGS. 13A,B, there are illustrated sectional side views of sensor modules 130 according to embodiments. The sensor module 130 includes a semiconductor chip 131 which is attached to a carrier 132. A first recess 131.1 of the semiconductor chip 131 forms a first cavity with the carrier 132 and a second recess 131.2 of the semiconductor chip 131 forms a second cavity with the carrier 132. In contrast to the embodiment of FIGS. 4A-C, the carrier 132 is arranged as a cover plate in a position above the semiconductor chip 131. The carrier 132 is structured to form a coupling channel between the first recess 131.1 and the second recess 131.2. Moreover, the semiconductor chip 131 is attached to a second carrier 133 including a base plate 133.1, a first metallization layer 133.2 and a second metallization layer 133.3. The second carrier 133 furthermore includes an opening 133.11 which serves as a sound opening. The second metallization layer 133.3 includes an outer electrical contact area 133.31 which may serve as a common mass terminal of the sensor module 130 and one or two shield layers 134 may be connected with this outer electrical contact area 133.31 and extend over the carrier 132 in order to shield the sensor module 130 from spurious electrical signals from the outside. FIG. 13B illustrates one embodiment of a sensor module 135 which is comparable to the embodiment of FIG. 13A with the only difference that the carrier 137 includes a base layer 137.1 and a further layer 137.2 wherein the further layer 137.2 is structured to form the coupling channel between the first recess 136.1 and the second recess 136.2 of the semiconductor chip 136.

Referring to FIGS. 14A,B, there are illustrated sectional side views of sensor modules according to embodiments. These embodiments are comparable to the embodiments as described above in connection with FIGS. 13A,B besides the fact that not the carrier is structured to form the coupling channel between the first and second recess but instead the silicon is structured as was already described above in connection with the embodiments as illustrated in FIGS. 11A,B. FIG. 14A illustrates one embodiment of a sensor module 140 in which the semiconductor material is partly removed between the two recesses whereas FIG. 14B illustrates one embodiment in which the semiconductor material is completely removed between the recesses.

Referring to FIG. 15, there is illustrated a sectional side view of a sensor module 150 according to one embodiment. The embodiment as depicted in FIG. 15 is comparable to the embodiment as described above in connection with FIG. 13A, besides the fact that an encapsulation layer 159 is deposited above the carrier 152 in order to form a molded package.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:
1. A sensor module, comprising:
a carrier;
a semiconductor chip comprising a first recess and a second recess in a main surface of the semiconductor chip,
a portion of the main surface of the semiconductor chip extending between the first recess and the second recess, sidewalls of the first recess being perpendicular to the main surface of the semiconductor chip;
a further semiconductor chip mounted to the carrier, the further semiconductor chip to process electrical signals received from the semiconductor chip; and
a housing attached to the carrier, the housing comprising a ceiling wall and side walls connected to the ceiling wall and to the carrier, the ceiling wall comprising a through-hole;
wherein the semiconductor chip is mounted to the carrier such that the first recess forms a first cavity with the carrier and the second recess forms a second cavity with the carrier;
wherein the first cavity is in fluid connection with the second cavity via a recess formed in the carrier; and
wherein the recess formed in the carrier extends between the first cavity and the second cavity directly opposite to the portion of the main surface of the semiconductor chip that extends between the first recess and the second recess.

2. The sensor module of claim 1, wherein the first cavity and the second cavity form a common cavity that is hermetically sealed.

3. The sensor module of claim 1, further comprising:
a membrane defined by the first recess.

4. The sensor module of claim 1, wherein the first recess and the second recess have the same depth.

5. The sensor module of claim 1, wherein the second cavity is as large as, or larger than the first cavity.

6. A method for fabricating a sensor module, comprising:
forming a first recess and a second recess in a main surface of a semiconductor chip such that a portion of the main surface of the semiconductor chip extends between the first recess and the second recess and such that the first recess has sidewalls perpendicular to the main surface of the semiconductor chip;
mounting the semiconductor chip to a carrier such that the first recess forms a first cavity with the carrier and the second recess forms a second cavity with the carrier and the first cavity is in fluid connection with the second cavity via a recess formed in the carrier;
mounting a further semiconductor chip to the carrier, the further semiconductor chip to process electrical signals received from the semiconductor chip; and
attaching a housing to the carrier, the housing comprising a ceiling wall and side walls connected to the ceiling wall, the ceiling wall comprising a through-hole,
wherein the recess formed in the carrier extends between the first cavity and the second cavity directly opposite to the portion of the main surface of the semiconductor chip that extends between the first recess and the second recess.

7. The method of claim 6, further comprising:
forming the first recess and the second recess by etching.

8. The method of claim 6, further comprising:
forming the first recess such that it is defined by a membrane.

9. The method of claim 6, further comprising:
forming the first recess and the second recess such that they have the same depth.

10. The method of claim 6, further comprising:
mounting the semiconductor chip to the carrier such that the first cavity and the second cavity form a common cavity that is hermetically sealed.

11. A module comprising:
a carrier; and
a microphone semiconductor chip comprising a first recess and a second recess in a main surface, configured such that the first recess forms a first cavity with the carrier and the second recess forms a second cavity with the carrier, wherein a portion of the main surface of the semiconductor chip extends between the first recess and the second recess;
wherein the first recess and the second recess have different depths, and
wherein the first cavity is in fluid connection with the second cavity via a recess formed in the carrier, an opening to the recess formed in the carrier extending across the first recess, the second recess, and the portion of the main surface of the semiconductor chip extending between the first recess and the second recess.

12. A sensor module, comprising:
a carrier;
a micro-electro-mechanical microphone semiconductor chip comprising a first recess and a second recess in a main surface of the semiconductor chip, a portion of the main surface of the semiconductor chip extending between the first recess and the second recess;
wherein the semiconductor chip is mounted to the carrier such that the first recess forms a first cavity with the carrier and the second recess forms a second cavity with the carrier;
wherein the first cavity is in fluid connection with the second cavity via a recess formed in the carrier; and
wherein an opening to the recess formed in the carrier extends across the first cavity and the second cavity and directly opposite to the portion of the main surface of the semiconductor chip that extends between the first recess and the second recess.

13. The sensor module of claim 12, wherein the first cavity and the second cavity form a common cavity that is hermetically sealed.

14. The sensor module of claim 12, wherein the first recess and the second recess have the same depth.

15. The sensor module of claim 12, wherein the second cavity is larger than the first cavity.

16. The sensor module of claim 12, wherein sidewalls of the first recess are perpendicular to the main surface of the semiconductor chip, and
wherein sidewalls of the second recess are perpendicular to the main surface of the semiconductor chip.

17. A method for fabricating a sensor module, comprising:
forming a first recess and a second recess in a main surface of a semiconductor chip such that a portion of the main surface of the semiconductor chip extends between the first recess and the second recess to provide a micro-electro-mechanical microphone semiconductor chip; and
mounting the semiconductor chip to a carrier such that the first recess forms a first cavity with the carrier and the second recess forms a second cavity with the carrier and the first cavity is in fluid connection with the second cavity via a recess formed in the carrier,
wherein an opening to the recess formed in the carrier extends across the first cavity and the second cavity and directly opposite to the portion of the main surface of the semiconductor chip that extends between the first recess and the second recess.

18. The method of claim 17, further comprising:
forming the first recess and the second recess by etching.

19. The method of claim 17, further comprising:
forming the first recess and the second recess such that they have the same depth.

20. The method of claim 17, further comprising:
mounting the semiconductor chip to the carrier such that the first cavity and the second cavity form a common cavity that is hermetically sealed.

21. The method of claim 17, wherein forming the first recess comprises forming the first recess having sidewalls perpendicular to the main surface of the semiconductor chip, and
wherein forming the second recess comprises forming the second recess having sidewalls perpendicular to the main surface of the semiconductor chip.

* * * * *